(12) United States Patent
Czapski

(10) Patent No.: US 6,297,512 B1
(45) Date of Patent: Oct. 2, 2001

(54) DOUBLE SHIELD FOR ELECTRON AND ION BEAM COLUMNS

(75) Inventor: Steven M. Czapski, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/052,583

(22) Filed: Mar. 31, 1998

(51) Int. Cl.[7] .................................................. H01B 7/34
(52) U.S. Cl. ........................................ 250/515.1; 250/505.1
(58) Field of Search .............................. 250/515.1, 505.1, 250/310, 396 R

(56) References Cited

U.S. PATENT DOCUMENTS

| | | | |
|---|---|---|---|
| 4,508,967 | * 4/1985 | Boissel et al. | 250/310 |
| 4,701,623 | * 10/1987 | Beasley | 250/396 R |
| 5,029,249 | * 7/1991 | Ohtaka | 250/310 |
| 5,082,995 | * 1/1992 | Paterson et al. | 250/515.1 |
| 5,376,792 | * 12/1994 | Schamber et al. | 250/346 R |

* cited by examiner

Primary Examiner—Kiet T. Nguyen
(74) Attorney, Agent, or Firm—Robert D. Lott; Steven Lin

(57) ABSTRACT

The column surrounding an electron or ion beam is shielded with a second shield which is outside the column and isolated from the column, being connected to chassis ground at a location remote from the column. Also, wiring into the column is double shielded with the shields connected to ground at the end remote from the column and not at the column itself.

22 Claims, 2 Drawing Sheets

DOUBLE SHIELD FOR ELECTRON AND ION BEAM COLUMNS

BACKGROUND OF THE INVENTION

1. Field of the Invention

The present invention pertains to electron and ion beam columns, and, more particularly, to shielding of such columns from electromagnetic (EMI, RFI) interference.

2. Description of Related Art

Electron and ion beam columns use electrical lenses and scan coils, together with mechanical shields, to focus the electrons or ions in the column. In the areas of the column which the beam passes that are not in close proximity to a lense or a coil, the beam is subject to external electrical interference such as EMI, RFI, etc. Also subject to interference are the column control signals.

In addition, the control of these beams is becoming increasingly more stringent as geometries of integrated circuits are becoming smaller. For example, one use for an ion beam is to open a vertical connection in an integrated circuit by removing a vertical conductive region. With IC geometries used today and prior art ion beam systems, the beam must be accurate to within about 0.2 micrometers ($\mu$m) and must hold this accuracy during the entire operation which takes over 20 minutes. Typically, electron/ion beam system manufacturers do not guarantee image drift for as long as 20 minutes.

Therefore, it can be appreciated that preventing unwanted electrical noise from interfering with an electron or ion beam is highly desirable.

SUMMARY OF THE INVENTION

In accordance with the present invention, a double shield for an electron or ion beam has a metallic column enclosing a major portion of the beam and forming at least a portion of a vacuum retaining structure. The metallic column provides a first shield for the beam. A second shield is provided for the beam separate from the metallic column, the second shield and the metallic shield forming a double shield for the beam over a major portion of the metallic column.

Figure 1:
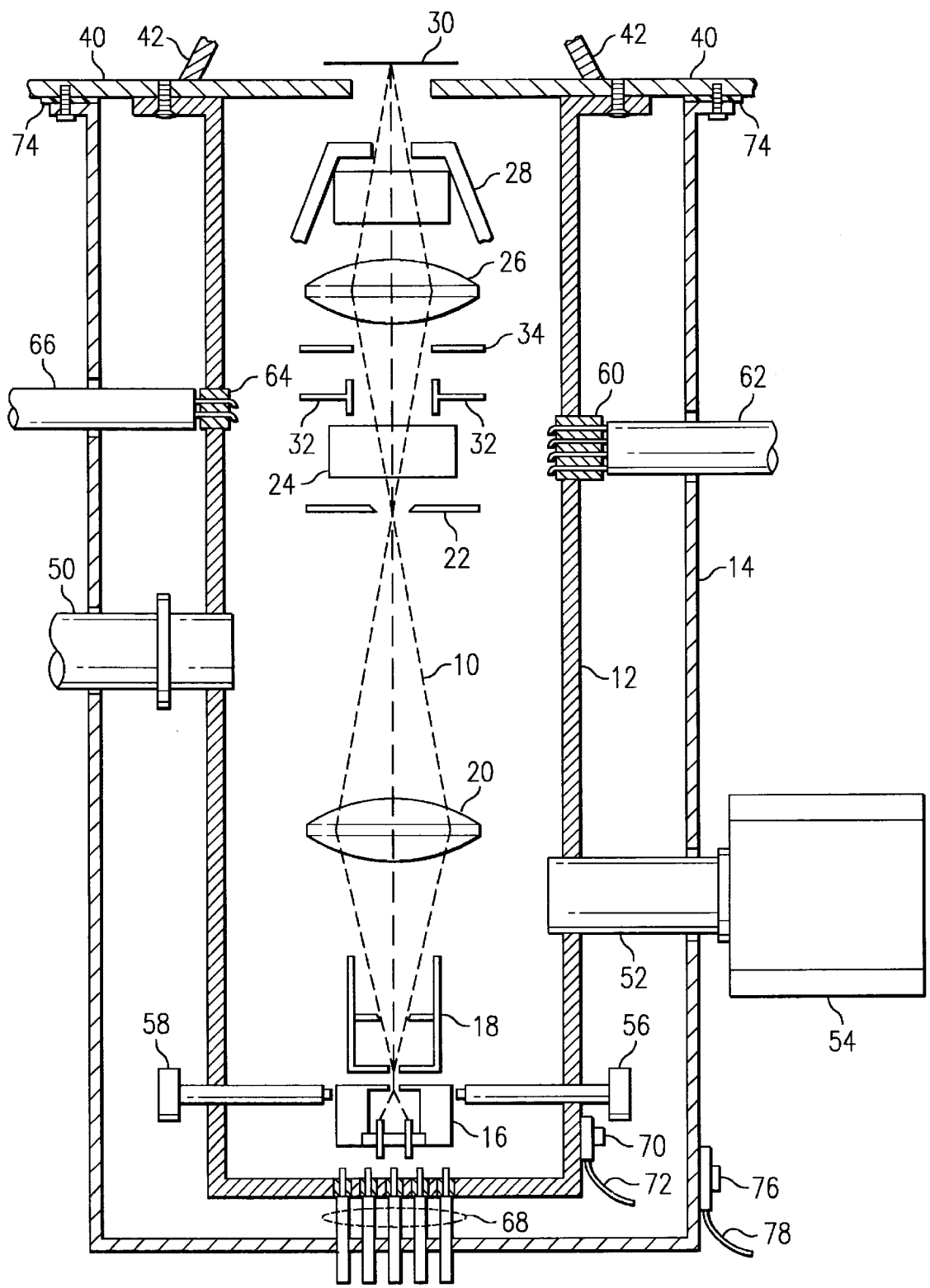
FIG. 1 is a partial cross sectional drawing, partial schematic diagram, of an electron or ion beam column according to the present invention.

It will be appreciated that for purposes of clarity and where deemed appropriate, reference numerals have been repeated in the figures to indicate corresponding features. Also, the relative size of various objects in the drawings has in some cases been distorted to more clearly show the invention.

DETAILED DESCRIPTION OF THE INVENTION

Referring to FIG. 1, an ion beam 10 is shown inside column 12 and is shielded with a second shield 14 according to the present invention. Beam 10 is produced by source 16 which can be a source of electrons or a source of ions. Beam 10 is directed by extractor cap and acceptance aperture 18 through first lens 20 (commonly referred to as lens 1), to beam defining aperture 22. As it continues, beam 10 is shaped by lens 2, steering quadrupole 24, and in normal operation passes through second lens 26 (commonly referred to as lens 2) and deflection plates 28 onto workpiece 30. Beam blanking plates 32 and blanking aperture 34 provide a means for diverting beam 10 away from workpiece 30.

Also shown in FIG. 1 is a top plate 40 which is a portion of the chassis of the vacuum system which supports column 12 and shield 14. Partially shown is cover plate 42 which provides the upper seal for the vacuum.

Numerous connections, both mechanical and electrical, must be made through column 12. Coupling 50 provides connection to a mechanical vacuum pump (not shown), and coupling 52 provides connection to ion pump 54. Other mechanical links such as feedthroughs 56, 58 and others not shown in FIG. 1 are necessary to position elements inside column 12. Beam 10 is generated and controlled by high voltages (voltages>100 volts) and column control signals which pass through column 12 such as octopole connector 60 shown with octupole cable 62 attached. Other connections are through lens cable connector 64 shown with lens cable 66 attached, through high voltage cables 68, and through other connections not shown in FIG. 1.

Column 12 has a ground connection 70 located near source 16 which in prior art systems is connected at all times to chassis ground by ground wire 72. However, with the present invention this connection is generally only used when the source is being conditioned prior to normal use of the source. The conditioning of the source involves heating the source and raising the voltage to the source in gradual steps so that peaks in the source (which disappear as the source becomes liquid) will not cause arching in the column. During this conditioning, which includes the gradual increasing of the source voltage to over 10 KV, ground connection 70 is connected to chassis ground. After the source has been conditioned, ground connection 70 is removed to avoid ground loops through column 12.

FIG. 1 is not drawn to scale in that beam 10 and its associated lenses, shields, etc. are smaller in relation to the inside of column 12 than shown. Much of the inside of column 10 is taken up with cabling to the various devices in column 10.

Although column 12 is made of steel and is electrically grounded to the chassis of the vacuum system through top plate 40, electrical fields external and internal to column 12 and ground currents through column 12 affect beam 10 creating aberrations in the beam. To help overcome these problems, shield 14 is placed around column 12 to form a second shield for column 12. Shield 14 is placed between column 12 and any other electrical equipment. For example, ion pump 54 is external to shield 14.

Shield 14, as presently used, is made of nickel plated cloth tape. However, one of the various high magnetic permeability materials, such as Mumetal, would provide improved magnetic shielding by better shunting electromagnetic fields (EMI, RFI) around beam 10. Advantageously, shield 14 is isolated by insulators 74 from top plate 40, but has a ground connection 76 remote from top plate 40 through wire 78 which is connected to the vacuum system chassis where the high voltages are generated. Thus, ground connection 76 is wired to a node remote from top plate 40. With this grounding connection, much of the electrical noise interference is intercepted before it reaches column 12 and there is not a current ground path through column 12.

Figure 2:
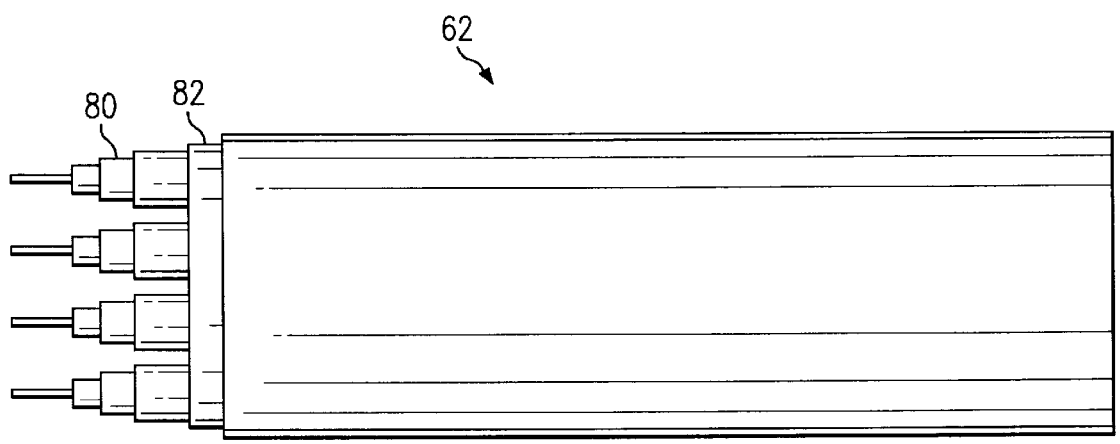
FIG. 2 is a drawing of column control and high voltage cables shown in FIG. 1.

Turning now to FIG. 2, a column control cable 62 is shown. Cable 62 has several column controlling conductors which are shielded from each other by a first shield 80, and the conductors are further shielded by second shield 82 forming a double shield for the conductors. Both shields 80 and 82 are connected to ground only at a node remote from column 12 such as the column control generator, and are left unconnected at column 12. Thus, ground loops through column 12 are further reduced. All of the high voltage and column controlling connections to column 12, which may have single or multiple isolated control or high voltage conductors, have their shields similarly connected.

In addition to the double shielding described above, other methods used to reduce column aberrations are removing the mechanical pump from the vacuum system chassis and isolating its mechanical vibrations from column 12, increasing as much as possible the physical distance of such electrical devices as ion pump 54, the ion pump controller (not shown), and the servo pump vacuum meter (not shown) from column 12. Moreover, all high voltage cables are separated from each other and other cables as much as possible.

Using the shielding described herein beam aberrations have been decreased which provides better focusing of the beam to enable concentrating the beam to an area as small as 10 nanometers in diameter. This reduced spot size also allows the time for ion milling operations to be reduced. For example a milling operation which previously took over 20 minutes can be accomplished with the present invention in about 6 minutes thus reducing the problems associated with image drift. In addition, the useful life of source 16 has increased with the present invention.

Although the invention has been described in part by making detailed reference to certain specific embodiments, such detail is intended to be, and will be understood to be, instructional rather than restrictive. It will be appreciated by those skilled in the art that many variations may be made on the structure and mode of operation without departing from the spirit and scope of the invention as disclosed in the teachings contained herein. For example the cable double shielding could be extended into column 12 such that the shields would extend up to the individual components inside column 12.

What is claimed is:

1. Apparatus for double shielding an ion beam which is used to alter surfaces of semiconductor materials, comprising:
   a) a first shield enclosing and shielding an ion beam which is used to alters surfaces of semiconductor materials; and
   b) a second shield separate from said first shield, wherein said second shield is for said ion beam and surrounds and encompasses said first shield and said first and second shields form a double shield around said ion beam; and
   c) wherein said first shield is electrically isolated from said second shield and wherein said first and second shields are each separately grounded so that said second shield intercepts and prevents noise from reaching said first shield.

2. The apparatus set forth in claim 1 wherein said first shield is positioned between said ion beam and said second shield.

3. The apparatus set forth in claim 1 wherein said second shield is made of a material to provide an electromagnetic shunt around said ion beam.

4. The apparatus set forth in claim 1 further comprising column control cables passing through said first and second shields wherein each of the column control cables has column controlling conductors and further has a first conductor shield around each of the column controlling conductors and a second conductor shield around all of the column controlling conductors in which each pair of the first and second conductor shields form a double conductor shield for each of the respective column controlling conductors and wherein said first and second conductor shields are coupled to a ground different from said ground of said first shield.

5. The apparatus set forth in claim 1 wherein said first shield is insulated from electrical contact from said second shield.

6. Apparatus for double shielding an ion beam which is used to alters surfaces of semiconductor materials, comprising:
   a) a first shield enclosing and shielding an ion beam which is used to alter surfaces of semiconductor materials; and
   b) a second shield separate from said first shield, wherein said second shield is for said ion beam and surrounds and encompasses said first shield and said first and second shields form a double shield around said ion beam; and
   c) wherein said first and second shields are separately grounded and wherein each column control cable, passing through said first and second shields, has column controlling conductors and wherein each column control cable further has a first conductor shield around each of the column controlling conductors and a second conductor shield around all of the column controlling conductors in which each pair of the first and second conductor shields form a double conductor shield for each of the respective column controlling conductors and wherein said first and second conductor shields are coupled to a ground different from said ground of said first shield.

7. The apparatus set forth in claim 6 wherein said first shield is positioned between said ion beam and said second shield.

8. The apparatus set forth in claim 6 wherein said second shield is made of a material to provide an electromagnetic shunt around said ion beam.

9. Apparatus for double shielding an ion beam which is used to alter surfaces of semiconductor materials, comprising:
   a) a first shield enclosing and shielding an ion beam which is used to alter surfaces of semiconductor materials; and
   b) a second shield separate from said first shield, wherein said second shield is for said ion beam and surrounds and encompasses said first shield and said first and second shields form a double shield around said ion beam; and
   c) wherein said first shield is coupled to a chassis ground for said apparatus and said second shield is isolatedly coupled to a separate ground for at least another electrical device and said separate ground intercepts noise from said at least another electrical device from being reached at said first shield.

10. The apparatus set forth in claim 9 further comprising column control cables passing through said first and second shields wherein each of the column control cables has column controlling conductors and further has a first conductor shield around each of the column controlling conductors and a second conductor shield around all of the column controlling conductors in which each pair of the first and second conductor shields form a double conductor shield for each of the respective column controlling conductors and wherein said first and second conductor shields are coupled to a ground different from said ground of said first shield.

11. The apparatus set forth in claim 9 wherein said first shield is positioned between said ion beam and said second shield.

12. The apparatus set forth in claim 9 wherein said second shield is made of a material to provide an electromagnetic shunt around said ion beam.

13. A metallic shield that surrounds a metallic column which shields an ion beam that alters surfaces of semiconductor materials, comprising:
   a metallic container that surrounds and is electrically isolated from a metallic column which shields an ion beam that alters surfaces of semiconductor materials, wherein said metallic container and said metallic column are each separately coupled to a ground potential and wherein said metallic container intercepts and prevents noise from reaching said metallic column and wherein said metallic container that surrounds said metallic column double shields said ion beam.

14. The metallic shield set forth in claim 13 further comprising each electrical wire, which passes through said metallic container and said metallic column, is grounded to the same ground potential of said metallic container.

15. The metallic shield set forth in claim 14 wherein the each electrical wire has column controlling conductors and further has a first conductor shield around each of the column controlling conductors and a second conductor shield around all of the column controlling conductors in which each pair of the first and second conductor shields form a double conductor shield for each of the respective column controlling conductors.

16. Method for double shielding an ion beam which is used to alter surfaces of semiconductor materials, comprising:
   a) enclosing and shielding, by a first shield, an ion beam which is used to alter surfaces of semiconductor materials;
   b) surrounding and encompassing, by a second shield separate from said first shield, said first shield wherein said first and second shields form a double shield around said ion beam; and
   c) electrically isolating said first shield from said second shield and separately grounding each of said first and second shields so that said second shield intercepts and prevents noise from reaching said first shield.

17. The method set forth in claim 16 further comprising:
   positioning said first shield between said ion beam and said second shield.

18. The method set forth in claim 16 further comprising:
   passing column control cables through said first and second shields wherein each of the column control cables has column controlling conductors and further has a first conductor shield around each of the column controlling conductors and a second conductor shield around all of the column controlling conductors in which each pair of the first and second shields form a double conductor shield for each of the respective column controlling conductors; and coupling said first and second conductor shields to a ground different from said ground of said first shield.

19. The method set forth in claim 16 further comprising:
   insulating said first shield from being in electrical contact from said second shield.

20. Method for double shielding an ion beam which is used to alter surfaces of semiconductor materials, comprising:
   a) enclosing and shielding, by a first shield, an ion beam which is used to alter surfaces of semiconductor materials; and
   b) surrounding and encompassing, by a second shield separate from said first shield, said first shield wherein said first and second shields form a double shield around said ion beam; and
   c) separately grounding said first and second shields and passing a column control cable through said first and second shields wherein said column control cable has column controlling conductors and further has a first conductor shield around each of the column controlling conductors and a second conductor shield around all of the column controlling conductors in which each pair of the first and second conductor shields form a double conductor shield for each of the respective column controlling conductors and wherein said first and second conductor shields are coupled to a ground different from said ground of said first shield.

21. Method for double shielding an ion beam which is used to alter surfaces of semiconductor materials, comprising:
   a) enclosing and shielding, by a first shield, an ion beam which is used to alter surfaces of semiconductor materials;
   b) surrounding and encompassing, by a second shield separate from said first shield, said first shield wherein said first and second shields form a double shield around said ion beam; and
   c) coupling said first shield to a chassis ground for said apparatus and isolatedly coupling said second shield to a separate ground for at least another electrical device and intercepting, by said separate ground, noise from said at least another electrical device from being reached by said first shield.

22. The method set forth in claim 21 further comprising:
   passing column control cables through said first and second shields wherein each of the column control cables has column controlling conductors and further has a first conductor shield around each of the column controlling conductors and a second conductor shield around all of the column controlling conductors in which each pair of the first and second conductor shields form a double conductor shield for each of the respective column controlling conductors; and
   coupling said first and second conductor shields to a ground different from said ground of said first shield.

* * * * *